(12) United States Patent
Du

(10) Patent No.: US 10,580,375 B2
(45) Date of Patent: Mar. 3, 2020

(54) GATE DRIVE CIRCUIT

(71) Applicant: Shenzhen China Star Optoelectronics Technology Co., Ltd., Shenzhen, Guangdong (CN)

(72) Inventor: Peng Du, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 274 days.

(21) Appl. No.: 15/500,114

(22) PCT Filed: Jan. 18, 2017

(86) PCT No.: PCT/CN2017/071483
§ 371 (c)(1),
(2) Date: Dec. 7, 2017

(87) PCT Pub. No.: WO2018/040484
PCT Pub. Date: Mar. 8, 2018

(65) Prior Publication Data
US 2018/0211628 A1 Jul. 26, 2018

(30) Foreign Application Priority Data

Aug. 31, 2016 (CN) .......................... 2016 1 0797207

(51) Int. Cl.
*G11C 19/00* (2006.01)
*G09G 3/36* (2006.01)
(Continued)

(52) U.S. Cl.
CPC ............. *G09G 3/3677* (2013.01); *G09G 3/20* (2013.01); *G09G 3/36* (2013.01);
(Continued)

(58) Field of Classification Search
None
See application file for complete search history.

(56) References Cited

U.S. PATENT DOCUMENTS 8,019,039 B1 * 9/2011 Tsai ........................ G11C 19/28
377/64
2010/0150303 A1 6/2010 Tsai et al.
(Continued)

FOREIGN PATENT DOCUMENTS

CN 104200770 A 12/2014
CN 104637462 A 5/2015
(Continued)

OTHER PUBLICATIONS

International Search Report dated May 16, 2017 for International Patent Application No. PCT/CN2017/071483.
(Continued)

*Primary Examiner* — Tuan T Lam

(57) ABSTRACT

Disclosed is a gate drive circuit. The circuit includes multiple stages of gate drive units, and a gate drive unit in each stage includes a pull-up control module which outputs a pull-up control signal based on a previous stage of gate drive signal, a first pull-up module connected to the pull-up control module, a boost module connected to the first pull-up module, a second pull-up module connected to the first pull-up module, and a pull-down module connected to the first pull-up module and the second pull-up module.

13 Claims, 3 Drawing Sheets

(51) Int. Cl.
*G09G 3/20* (2006.01)
*G11C 19/28* (2006.01)

(52) U.S. Cl.
CPC .............. *G09G 2310/0267* (2013.01); *G09G 2310/0286* (2013.01); *G09G 2320/0223* (2013.01); *G11C 19/28* (2013.01)

(56) References Cited

U.S. PATENT DOCUMENTS

| | | | | |
|---|---|---|---|---|
| 2012/0269315 | A1* | 10/2012 | Jang | G11C 19/28 377/75 |
| 2013/0028370 | A1* | 1/2013 | Kikuchi | G09G 3/3677 377/64 |
| 2014/0118052 | A1* | 5/2014 | Liu | H03K 5/15093 327/394 |
| 2016/0171915 | A1* | 6/2016 | Lee | G09G 3/20 345/211 |
| 2017/0092172 | A1* | 3/2017 | Wang | G09G 3/20 |
| 2017/0132968 | A1* | 5/2017 | Qian | H03K 19/00315 |
| 2017/0200418 | A1* | 7/2017 | Zhang | G11C 19/28 |
| 2018/0151146 | A1* | 5/2018 | Chang | G09G 3/2003 |
| 2018/0211716 | A1* | 7/2018 | Ma | G09G 3/20 |

FOREIGN PATENT DOCUMENTS

| | | |
|---|---|---|
| CN | 104835476 A | 8/2015 |
| CN | 104966500 A | 10/2015 |
| CN | 105378822 A | 3/2016 |
| CN | 105702190 A | 6/2016 |
| CN | 106251818 A | 12/2016 |

OTHER PUBLICATIONS

Chinese Office Action dated Feb. 14, 2018 for Chinese Patent Application No. 2016107972075.

* cited by examiner

GATE DRIVE CIRCUIT

CROSS-REFERENCE TO RELATED APPLICATIONS

This application claims the priority of Chinese patent application CN 201610797207.5, entitled "Gate drive circuit" and filed on Aug. 31, 2016, the entirety of which is incorporated herein by reference.

FIELD OF THE INVENTION

The present disclosure relates to the technical field of liquid crystal display, and in particular to a gate drive circuit of a liquid crystal display panel.

BACKGROUND OF THE INVENTION

With the development of display technology, thin film transistor liquid crystal display (TFT-LCD) devices have become important display devices in modern IT and video products. With the constant development of flat panel display technology, high resolution, high contrast, high refresh rate, narrow-frame and thinning design have become a main development trend of flat panel display. Gate-driver On Array (GOA) technology is now widely used in flat display panels. By using the GOA technology, costs of gate drive chips can be saved and widths of frames of display panels can also be reduced. The GOA technology is beneficial to the popular narrow-frame design at present, and is also an important technology in panel design in the future.

A boost capacitor is often required in a conventional a-Si (amorphous silicon) GOA circuit. As shown in FIG. 1, in a gate drive unit of a conventional GOA circuit, one end of a boost capacitor is connected to node Q, and the other end thereof is connected to a gate line of the gate drive unit used for outputting a gate drive signal. When the gate drive signal is outputted, the boost capacitor can raise up a potential at node Q to ensure normal output of the gate drive unit.

However, such a-Si GOA circuit also has a disadvantage. Since the boost capacitor is directly connected to the gate line, when the gate drive signal is outputted, the boost capacitor pulls up a potential at node Q on the one hand, and it also becomes a parasitic capacitor of the gate line on the other hand. This directly results in more serious RC delay of the gate drive signal. In particular, with an increase of panel size and resolution, load capacitance of gate lines will become increasingly larger. According to the above design, the boost capacitor will make the problem of RC delay of the gate drive signal become more prominent. In this case, it is likely to cause that pixels in the panel are not sufficiently charged, thus adversely affecting display quality of the panel.

SUMMARY OF THE INVENTION

In order to solve the problem described above, the present disclosure provides a new gate drive circuit in which a new circuit structure is designed.

The present disclosure provides a gate drive circuit which comprises multiple stages of gate drive units. A gate drive unit in each stage comprises a pull-up control module, a first pull-up module, a boost module, a second pull-up module, and a pull-down module. The pull-up control module is configured to output a pull-up control signal based on a previous stage of gate drive signal. The first pull-up module is connected to the pull-up control module to receive the pull-up control signal, and configured to pull up a potential of an output terminal of the first pull-up module to a first high level in accordance with the pull-up control signal and a node control signal. The boost module is connected to the first pull-up module, and configured to, when the output terminal of the first pull-up module is pulled up to a second high level in accordance with the node control signal, pull up a potential of a pull-up control signal input terminal of the first pull-up module to the second high level. The second pull-up module is connected to the first pull-up module, and configured to output a present stage of gate drive signal based on a clock control signal when the potential of the output terminal of the first pull-up module is pulled up to the second high level. The pull-down module is connected to the first pull-up module and the second pull-up module, and configured to pull down potentials of the output terminal and the pull-up control signal input terminal of the first pull-up module, and a potential of a gate drive signal output terminal of the second pull-up module to a negative potential based on a pull-down control signal.

According to embodiments of the present disclosure, the node control signal is a square wave signal, and a pulse width thereof is the same as that of the clock control signal.

According to embodiments of the present disclosure, the pull-up control module comprises a pull-up control transistor. A gate of the pull-up control transistor is connected to a source thereof for receiving a previous stage of gate drive signal, and a drain thereof is configured to output the pull-up control signal.

According to embodiments of the present disclosure, the first pull-up module comprises a first pull-up transistor. A gate of the first pull-up transistor receives the pull-up control signal, a source thereof receives the node control signal, and a drain thereof serves as an output terminal.

According to embodiments of the present disclosure, the boost module comprises a boost capacitor. Two ends of the boost capacitor are respectively connected to the output terminal and the pull-up control signal input terminal of the first pull-up module.

According to embodiments of the present disclosure, the second pull-up module comprises a second pull-up transistor. A gate of the second pull-up transistor is connected to the output terminal of the first pull-up module, a source thereof receives the clock control signal, and a drain thereof is configured to output the present stage of gate drive signal.

According to embodiments of the present disclosure, the pull-down module comprises a first pull-down transistor, a second pull-down transistor, and a third pull-down transistor. A gate of the first pull-down transistor receives the pull-down control signal, a source thereof is connected to the gate drive signal output terminal of the second pull-up module, and a drain thereof is connected to a negative potential. A gate of the second pull-down transistor receives the pull-down control signal, a source thereof is connected to the output terminal of the first pull-up module, and a drain thereof is connected to the negative potential. A gate of the third pull-down transistor receives the pull-down control signal, a source thereof is connected to the pull-up control signal input terminal of the first pull-up module, and a drain thereof is connected to the negative potential.

According to embodiments of the present disclosure, in the above described gate drive circuit, the gate drive unit in each stage further comprises a first pull-down holding module and a second pull-down holding module, which operate alternately according to a first pull-down holding control signal and a second pull-down holding control signal, respectively, for maintaining the potential of the output terminal of the first pull-up module and the potential of the gate drive signal output terminal of the second pull-up module at the negative potential. The first pull-down holding control signal and the second pull-down holding control signal have opposite phases.

According to embodiments of the present disclosure, the first pull-down holding module comprises a first transistor, with a gate thereof being connected to a source thereof for receiving the first pull-down holding control signal. The first pull-down holding module further comprises a second transistor, with a gate thereof receiving a voltage signal of the output terminal of the first pull-up module, a source thereof being connected to a drain of the first transistor, and a drain thereof being connected to the negative potential. The first pull-down holding module further comprises a third transistor, with a gate thereof being connected to the gate of the first transistor, and a source thereof being connected to the source of the first transistor. The first pull-down holding module further comprises a fourth transistor, with a gate thereof being connected to the gate of the second transistor, a source thereof being connected to a drain of the third transistor, and a drain thereof being connected to the negative potential. The first pull-down holding module further comprises a fifth transistor, with a gate thereof being connected to the drain of the third transistor, a source thereof being connected to the output terminal of the first pull-up module, and a drain thereof being connected to the negative potential. The first pull-down holding module further comprises a sixth transistor, with a gate thereof being connected to the drain of the third transistor, a source thereof being connected to the gate drive signal output terminal of the second pull-up module, and a drain thereof being connected to the negative potential.

According to embodiments of the present disclosure, the second pull-down holding module comprises a seventh transistor and an eighth transistor. A gate of the seventh transistor receives the second pull-down holding control signal, a source thereof is connected to an input terminal of a previous stage of gate drive signal of the pull-up control module, and a drain thereof is connected to the output terminal of the first pull-up module. A gate of the eighth transistor is connected to the gate of the seventh transistor, a source thereof is connected to the gate drive signal output terminal of the second pull-up module, and a drain thereof is connected to the negative potential.

According to the present disclosure, a circuit structure of a gate drive circuit is re-designed, so that a potential of node Q in a gate drive unit is directly controlled by a node control signal VQ provided by a drive chip. Moreover, a connection mode of a boost capacitor is changed, so that the boost capacitor is no longer connected to a gate line of a present stage of gate drive unit for outputting a gate drive signal. In this manner, load capacitance of the gate line can be reduced and RC delay of the gate drive signal can be reduced without changing working waveforms of related circuits. The present disclosure is favorable for the improvement of display effects and display reliabilities of a display panel.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The drawings necessary for explaining the embodiments are introduced briefly below to illustrate the technical solutions of the embodiments of the present disclosure more clearly.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

Embodiment 1

The technical solution of the present disclosure will be explained below by means of description of improvement on a conventional gate drive circuit.

Figure 1:
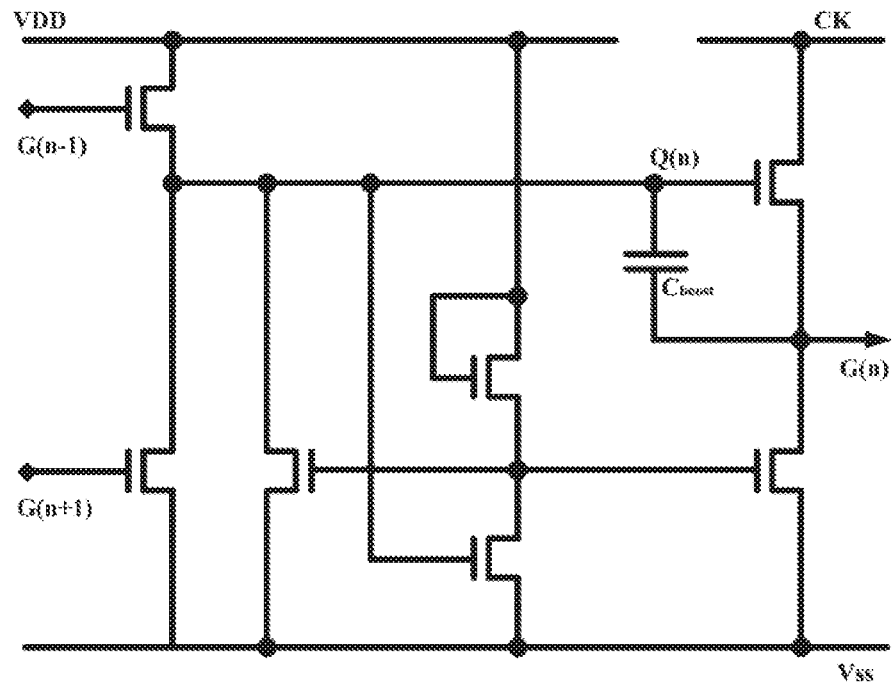
FIG. 1 schematically shows a circuit structure of an $n^{th}$ gate drive unit in a conventional gate drive circuit.
Figure 2:
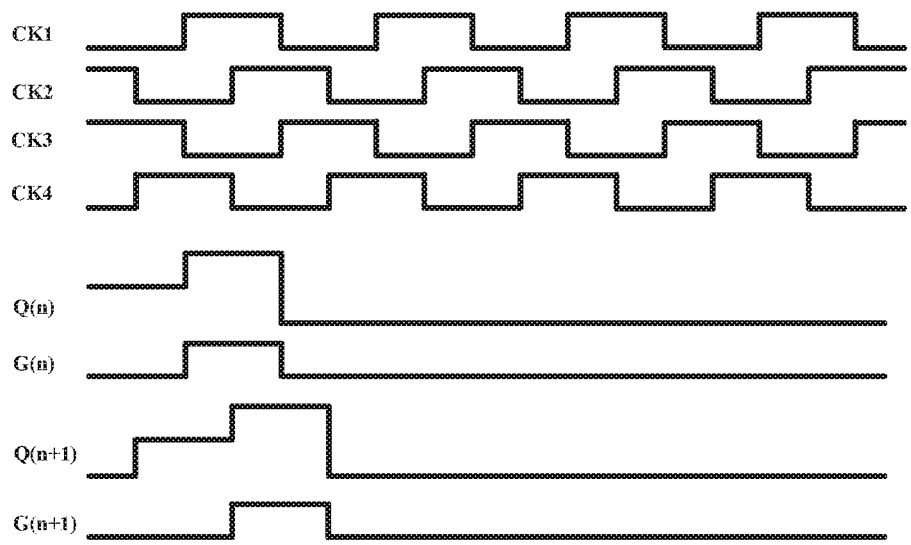
FIG. 2 is a signal waveform diagram of the $n^{th}$ gate drive unit in the gate drive unit as shown in FIG. 1.

FIG. 1 schematically shows a circuit structure of an $n^{th}$ gate drive unit in a conventional gate drive circuit. It can be seen from FIG. 1, four transistors and one boost capacitor form a basic structure of the gate drive unit. Besides, due to the reliability problem of a-Si, in addition to this basic structure, there is an auxiliary pull-down circuit module, which is mainly used for ensuring output of the gate drive unit and a low potential at node Q when the gate line is turned off, thereby improving the reliability of the GOA circuit. It can be seen from FIG. 1 that, one end of a boost capacitor Cboost is connected to node Q, and the other end thereof is connected to the gate line. When the gate drive unit outputs a gate drive signal, the boost capacitor Cboost can pull up a potential at node Q, so as to ensure the normal output of the gate drive unit. FIG. 2 shows waveform diagrams of control signals of two adjacent stages of gate drive units, potentials of node Q, and outputted gate drive signals. An $(n+1)^{th}$ gate drive unit is taken as an example, and a potential Q(n+1) of node Q in the $(n+1)^{th}$ gate drive unit is pulled up for two times. When an $n^{th}$-gate drive unit outputs a gate drive signal G(n), the potential Q(n+1) of node Q in the $(n+1)^{th}$ gate drive unit is pulled up for a first time. When the $(n+1)^{th}$ gate drive unit outputs a gate drive signal G(n+1), the potential Q(n+1) of node Q in the $(n+1)^{th}$ gate drive unit is pulled up for a second time, so as to ensure normal output of the circuit. However, as described above, the boost capacitor Cboost is directly connected to the gate line which outputs the gate drive signal. When the boost capacitor pulls up the potential of node Q, it also serves as a parasitic capacitor of the gate line. Capacitance of the boost capacitor Cboost is often designed as a large value, which will result in more serious RC delay of the gate line. If the RC delay is severe, pixels in a display panel would not be sufficiently charged, thereby affecting display quality of the display panel. In particular, in designing of panels with large-size and high-resolution, the boost capacitor directly connected to the gate line has become an unfavorable factor.

Figure 3:
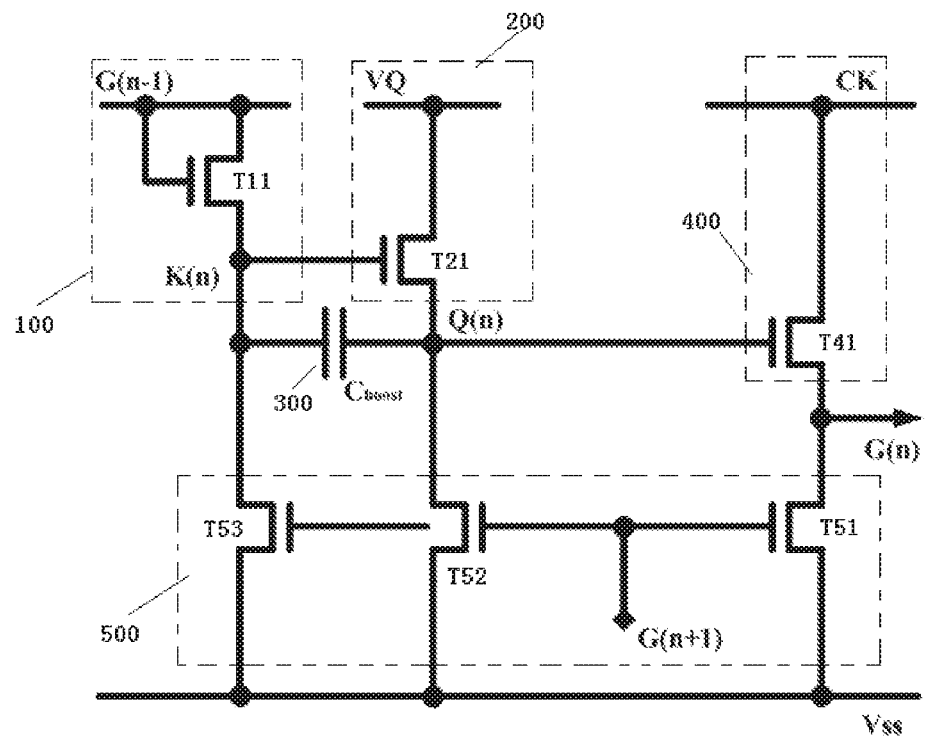
FIG. 3 schematically shows a circuit structure of an $n^{th}$ gate drive unit according to Embodiment 1 of the present disclosure.

In view of the above problem, the circuit structure of the gate drive unit is redesigned in the present disclosure. FIG. 3 is one embodiment of the present disclosure. The technical solution and operating principle of the present disclosure will be explained in details below with reference to a gate drive circuit as shown in FIG. 3.

As shown in FIG. 3, an $n^{th}$ gate drive unit mainly comprises a pull-up control module 100, a first pull-up module 200, a boost module 300, a second pull-up module 400, and a pull-down module 500.

The pull-up control module 100 is used for outputting a pull-up control signal based on a previous stage of gate drive signal. According to the present embodiment, the pull-up control module 100 comprises a pull-up control transistor T11. A gate of the pull-up control transistor T11 is connected to a source thereof for receiving a previous stage of gate drive signal, and a drain thereof outputs a pull-up control signal (not shown in FIG. 3). The previous stage of gate drive signal is preferably a gate drive signal G(n−1) outputted by a gate drive unit prior to a present stage of gate drive unit. Of course, in practical application, it may not be limited to this. For example, the previous stage of gate drive signal can also be a gate drive signal G(n−2) outputted by a $G(n-2)^{th}$ gate drive unit.

The first pull-up module 200 is connected to the pull-up control module 100 to receive the pull-up control signal and pull up a potential Q(n) of an output terminal Q of the first pull-up module 200 to a first high level in accordance with the pull-up control signal and a node control signal. According to the present embodiment, the first pull-up module 200 comprises a first pull-up transistor T21. A gate of the first pull-up transistor T21 is connected to the output terminal of the first pull-up module 200 to receive the pull-up control signal, a source thereof is connected to a drive chip (not shown in FIG. 3) to receive a node control signal VQ, and a drain thereof serves as the output terminal.

The boost module 300 is connected to the first pull-up module 200, and configured to, when the potential Q(n) of the output terminal Q of the first pull-up module 200 is pulled up from the first high level to a second high level in accordance with the node control signal VQ, pull up a potential K(n) of a pull-up control signal input terminal K of the first pull-up module 200 to the second high level. According to the present embodiment, the boost module 300 comprises a boost capacitor Cboost. Two ends of the boost capacitor Cboost are respectively connected to the output terminal Q and the pull-up control signal input terminal K of the first pull-up module 200.

The second pull-up module 400 is connected to the first pull-up module 200, and configured to, when the potential Q(n) of the output terminal Q of the first pull-up module 200 is pulled up to the second high level, output a present stage of gate drive signal G(n) based on a clock control signal CK. According to the present embodiment, the second pull-up module 400 comprises a second pull-up transistor T41. A gate of the second pull-up transistor T41 is connected to the output terminal Q of the first pull-up module 200, a source thereof receives the clock control signal CK, and a drain thereof serves as an output terminal for outputting the present stage of gate drive signal.

The pull-down module 500 is connected to the first pull-up module 200 and the second pull-up module 400, and configured to pull down potentials of the output terminal Q and the pull-up control signal input terminal K of the first pull-up module 200, and a potential of a gate drive signal output terminal of the second pull-up module 400 to a negative potential based on a pull-down control signal. According to the present embodiment, the pull-down module 500 comprises a first pull-down transistor T51, a second pull-down transistor T52, and a third pull-down transistor T53. A gate of the first pull-down transistor receives a pull-down control signal, a source thereof is connected to the gate drive signal output terminal of the second pull-up module 400, and a drain thereof is connected to a negative potential. A gate of the second pull-down transistor T52 receives the pull-down control signal, a source thereof is connected to the output terminal Q of the first pull-up module 200, and a drain thereof is connected to the negative potential. A gate of the third pull-down transistor T53 receives the pull-down control signal, a source thereof is connected to the pull-up control signal input terminal K of the first pull-up module 200, and a drain thereof is connected to the negative potential. The pull-down control signal is a next stage of gate drive signal, preferably a gate drive signal G(n+1) outputted by a next stage of gate drive unit. Of course, in practical application, it may not be limited to this. For example, the next gate drive signal can also be a gate drive signal G(n+2) outputted by a $G(n+2)^{th}$ gate drive unit.

The operating principle of the $n^{th}$ gate drive unit as shown in FIG. 3 will be described below in detail.

First, under an action of the gate drive signal G(n−1) outputted by the previous stage of gate drive unit, the pull-up control transistor T11 is turned on, and the potential K(n) of node K is pulled up. Under an action of the potential of node K, the first pull-up transistor T21 is turned on, so that the node control signal VQ is transmitted to node Q. At the moment, the node control signal VQ is at a relatively low first high level 30 V and thus the potential of node Q is also at the relatively low first high level 30 V. Under an action of the potential of node Q, the second pull-up transistor T41 is turned on, so that the clock control signal CK is transmitted to the gate line for outputting the present stage of gate drive signal. When the clock control signal CK is switched from −6 V to 30 V, the gate line outputs the present stage of gate drive signal G(n). In order to better output the present stage of gate drive signal G(n), it is necessary to further pull up the potential Q(n) of node Q. For this reason, according to the present embodiment, the potential of the node control signal VQ is pulled up from the first high level 30 V to a second high level 50 V, so that the potential Q(n) at node Q is further raised to the second high level 50 V. In this case, due to a coupling effect of the capacitor Cboost, the potential of node K is also raised. At last, when the present stage of gate drive signal G(n) comes to an end, under an action of the gate drive signal G(n+1) outputted by the next stage of gate drive unit, the first pull-down transistor T51, the second pull-down transistor T52, and the third pull-down transistor T53 are all turned on, and the potentials of the present stage of gate drive signal G(n), node K, and node Q are all pulled down to a negative potential Vss.

Figure 4:
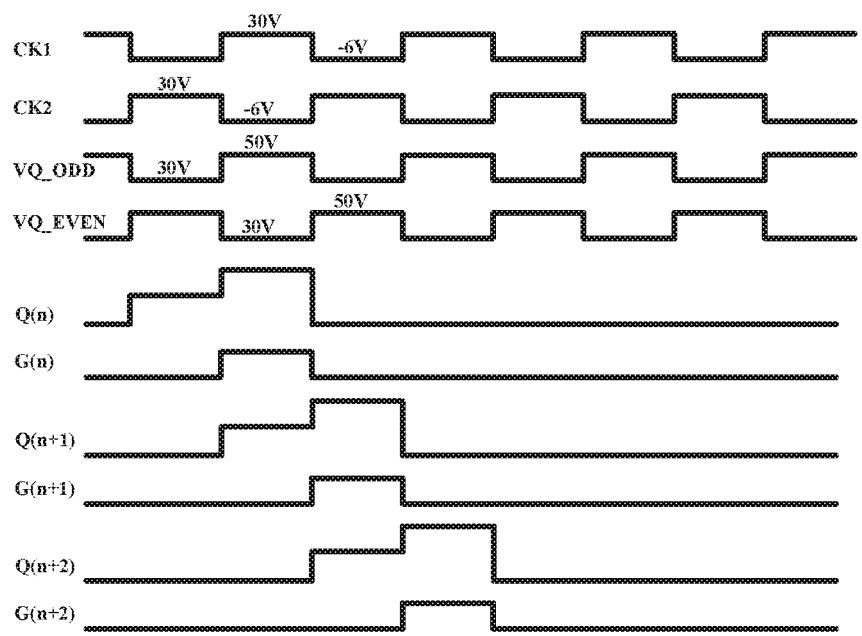
FIG. 4 is a signal waveform diagram of the $n^{th}$ gate drive unit in a gate drive circuit as shown in FIG. 3.

FIG. 4 is a signal waveform diagram showing practical operation of a circuit comprising gate drive units as shown in FIG. 3. It can be seen from FIG. 4 that, the circuit has two clock control signals CK1 and CK2, and two node control signals VQ_ODD and VQ_EVEN, which are respectively used in two adjacent gate drive units, i.e., an $n^{th}$ gate drive unit and an $(n+1)^{th}$ gate drive unit. Vss is a constant voltage negative potential. The two clock control signals CK1 and CK2 have opposite phases. The two node control signals VQ_ODD and VQ_EVEN are two square wave signals with different potentials. Pulse widths of the two node control signals are the same as those of the two clock control signals CK1 and CK2. Apart from the node control signals, the clock control signals are the same as those in a conventional GOA circuit. Besides, a potential Q(n) of node Q and an outputted gate drive signal G(n) in each stage of gate drive unit are also the same as those in the conventional GOA circuit. However, since the boost capacitor Cboost is connected between the output terminal Q and the pull-up control signal input terminal K of the first pull-up module 200, and is no longer directly connected to the gate line, the RC load of the gate line can be reduced, which can facilitate improvement of display quality and reliability of a panel.

Embodiment 2

A 6TFT1C structure as shown in FIG. 3 is a most basic circuit structure of a gate drive unit provided by the present disclosure. On this basis, there can be a lot of deformation and expansion. For example, based on the gate drive unit as shown in FIG. 3, the gate drive unit as shown in 5 is added with two auxiliary pull-down circuit modules, i.e., a first pull-down holding module 600 and a second pull-down holding module 700 which operate alternately according to a first pull-down holding control signal and a second pull-down holding control signal, respectively, for at least maintaining an output terminal Q of a first pull-up module 200 and a gate drive signal output terminal of a second pull-up module 400 at a low potential (for example, a negative potential Vss) to ensure normal operation of the circuit. The first pull-down holding control signal and the second pull-down holding control signal have opposite phases.

Preferably, the first pull-down holding module 600 comprises a first transistor T61, a second transistor T62, a third transistor T63, a fourth transistor T64, a fifth transistor T65, and a sixth transistor T66. A gate of the first transistor T61 is connected to a source thereof for receiving the first pull-down holding control signal (i.e., a clock control signal CK). A gate of the second transistor T62 receives a voltage signal of the output terminal Q of the first pull-up module 200, a source thereof is connected to a drain of the first transistor T61, and a drain thereof is connected to the negative potential Vss. A gate of the third transistor T63 is connected to the drain of the first transistor T61, and a source thereof is connected to the source of the first transistor T61. A gate of the fourth transistor T64 is connected to the gate of the second transistor T62, a source thereof is connected to a drain of the third transistor T63, and a drain thereof is connected to the negative potential Vss. A gate of the fifth transistor T65 is connected to the drain of the third transistor T63, a source thereof is connected to the output terminal Q of the first pull-up module 200, and a drain thereof is connected to the negative potential Vss. A gate of the sixth transistor T66 is connected to the drain of the third transistor T63, a source thereof is connected to the output terminal of the gate drive signal of the second pull-up module 400, and a drain thereof is connected to the negative potential Vss.

Preferably, the second pull-down holding unit 700 comprises a seventh transistor T71 and an eighth transistor T72. A gate of the seventh transistor T71 receives the second pull-down holding control signal (a clock control signal XCK having an opposite phase to the clock control signal CK), a source thereof is connected to an input terminal of a previous stage of gate drive signal of the pull-up control module 100, and a drain thereof is connected to the output terminal Q of the first pull-up module 200. A gate of the eighth transistor T72 is connected to the gate of the seventh transistor T71, a source thereof is connected to the gate drive signal output terminal of the second pull-up module 400, and a drain thereof is connected to the negative potential Vss.

Figure 5:
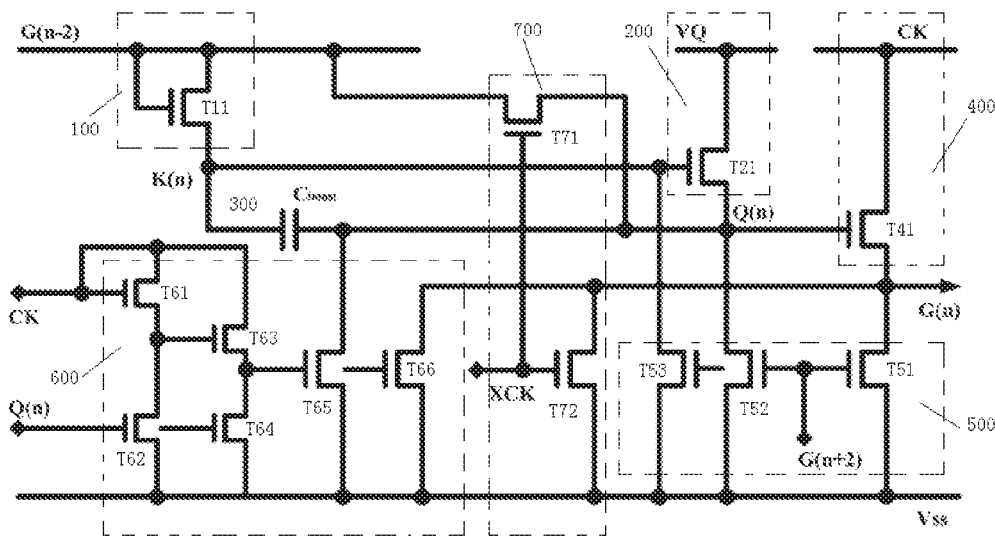
FIG. 5 schematically shows a circuit structure of an $n^{th}$ gate drive unit according to Embodiment 2 of the present disclosure.

The operation principle of the gate drive unit as shown in FIG. 5 is approximately the same as that of the gate drive unit as shown in 3, and will not be repeated here. It should be noted that, in the gate drive unit as shown in FIG. 5, the first pull-down holding module 600 and the second pull-down holding module 700 only maintain the potential of the output terminal Q of the first pull-up module 200 and the potential of the gate drive signal output terminal of the second pull-up module 400 at a low level. However, in practical application, a potential of a pull-up control signal input terminal K of the first pull-up module 200 can also be maintained at a low level by adding transistors.

Figure 6:
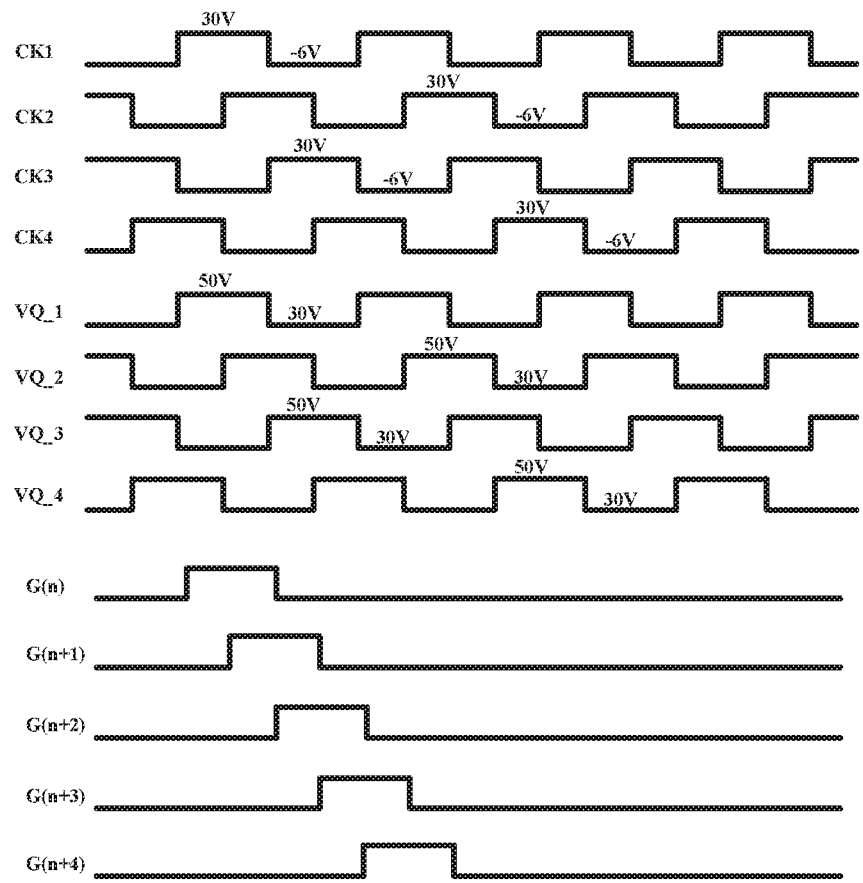
FIG. 6 is a signal waveform diagram of the $n^{th}$ gate drive unit in a gate drive circuit as shown in FIG. 5.

FIG. 6 is a signal waveform diagram showing practical operation of a circuit comprising the gate drive units as shown in FIG. 5. It can be seen from FIG. 6 that, in the circuit, there are four clock control signals CK1 to CK4 and four node control signals VQ_1 to VQ_4, which are respectively used in four adjacent stages of gate drive units, i.e., from $n^{th}$ gate drive unit to $(n+4)^{th}$ gate drive unit. Gate drive signals outputted by two adjacent stages of gate drive units have half regions thereof overlapped. A waveform of a gate drive signal and a potential Q outputted by each stage of gate drive unit are also the same as those of the conventional gate drive unit.

It should be noted that the above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

The invention claimed is:

1. A gate drive circuit, comprising multiple stages of gate drive units, wherein a gate drive unit in each stage comprises:
   a pull-up control module, which is configured to output a pull-up control signal based on a previous stage of gate drive signal;
   a first pull-up module, which is connected to the pull-up control module for receiving the pull-up control signal, and configured to pull up a potential of an output terminal of the first pull-up module to a first high level in accordance with the pull-up control signal and a node control signal;
   a boost module, which is connected to the first pull-up module, and configured to, when the output terminal of the first pull-up module is pulled up to a second high level in accordance with the node control signal, pull up a potential of a pull-up control signal input terminal of the first pull-up module to the second high level;
   a second pull-up module, which is connected to the first pull-up module, and configured to output a present stage of gate drive signal based on a clock control signal when the potential of the output terminal of the first pull-up module is pulled up to the second high level; and a pull-down module, which is connected to the first pull-up module and the second pull-up module, and configured to pull down potentials of the output terminal and the pull-up control signal input terminal of the first pull-up module, and a potential of a gate drive signal output terminal of the second pull-up module to a negative potential based on a pull-down control signal.

2. The gate drive circuit according to claim 1, wherein the node control signal is a square wave signal, and a pulse width thereof is the same as that of the clock control signal.

3. The gate drive circuit according to claim 2, wherein the pull-up control module comprises a pull-up control transistor, with a gate thereof being connected to a source thereof for receiving a previous stage of gate drive signal, and a drain thereof outputting the pull-up control signal.

4. The gate drive circuit according to claim 2, wherein the first pull-up module comprises a first pull-up transistor, with a gate thereof receiving the pull-up control signal, a source thereof receiving the node control signal, and a drain thereof serving as an output terminal.

5. The gate drive circuit according to claim 2, wherein the boost module comprises a boost capacitor, with two ends thereof being respectively connected to the output terminal and the pull-up control signal input terminal of the first pull-up module.

6. The gate drive circuit according to claim 2, wherein the second pull-up module comprises a second pull-up transistor, with a gate thereof being connected to the output terminal of the first pull-up module, a source thereof receiving the clock control signal, and a drain thereof outputting the present stage of gate drive signal.

7. The gate drive circuit according to claim 2, wherein the pull-down module comprises:
   a first pull-down transistor, with a gate thereof receiving the pull-down control signal, a source thereof being connected to the gate drive signal output terminal of the second pull-up module, and a drain thereof being connected to a negative potential;
   a second pull-down transistor, with a gate thereof receiving the pull-down control signal, a source thereof being connected to the output terminal of the first pull-up module, and a drain thereof being connected to the negative potential; and
   a third pull-down transistor, with a gate thereof receiving the pull-down control signal, a source thereof being connected to the pull-up control signal input terminal of the first pull-up module, and a drain thereof being connected to the negative potential.

8. The gate drive circuit according to claim 1, wherein the gate drive unit in each stage further comprises:
   a first pull-down holding module and a second pull-down holding module, which operate alternately according to a first pull-down holding control signal and a second pull-down holding control signal, respectively, for maintaining the potential of the output terminal of the first pull-up module and the potential of the gate drive signal output terminal of the second pull-up module at the negative potential,
   wherein the first pull-down holding control signal and the second pull-down holding control signal have opposite phases.

9. The gate drive circuit according to claim 2, wherein the gate drive unit in each stage further comprises:
   a first pull-down holding module and a second pull-down holding module, which operate alternately according to a first pull-down holding control signal and a second pull-down holding control signal, respectively, for maintaining the potential of the output terminal of the first pull-up module and the potential of the gate drive signal output terminal of the second pull-up module at the negative potential,
   wherein the first pull-down holding control signal and the second pull-down holding control signal have opposite phases.

10. The gate drive circuit according to claim 8, wherein the first pull-down holding module comprises:
    a first transistor, with a gate thereof being connected to a source thereof for receiving the first pull-down holding control signal;
    a second transistor, with a gate thereof receiving a voltage signal of the output terminal of the first pull-up module, a source thereof being connected to a drain of the first transistor, and a drain thereof being connected to the negative potential;
    a third transistor, with a gate thereof being connected to the gate of the first transistor, and a source thereof being connected to the source of the first transistor;
    a fourth transistor, with a gate thereof being connected to the gate of the second transistor, a source thereof being connected to a drain of the third transistor, and a drain thereof being connected to the negative potential;
    a fifth transistor, with a gate thereof being connected to the drain of the third transistor, a source thereof being connected to the output terminal of the first pull-up module, and a drain thereof being connected to the negative potential; and
    a sixth transistor, with a gate thereof being connected to the drain of the third transistor, a source thereof being connected to the gate drive signal output terminal of the second pull-up module, and a drain thereof being connected to the negative potential.

11. The gate drive circuit according to claim 9, wherein the first pull-down holding module comprises:
    a first transistor, with a gate thereof being connected to a source thereof for receiving the first pull-down holding control signal;
    a second transistor, with a gate thereof receiving a voltage signal of the output terminal of the first pull-up module, a source thereof being connected to a drain of the first transistor, and a drain thereof being connected to the negative potential;
    a third transistor, with a gate thereof being connected to the gate of the first transistor, and a source thereof being connected to the source of the first transistor;
    a fourth transistor, with a gate thereof being connected to the gate of the second transistor, a source thereof being connected to a drain of the third transistor, and a drain thereof being connected to the negative potential;
    a fifth transistor, with a gate thereof being connected to the drain of the third transistor, a source thereof being connected to the output terminal of the first pull-up module; and a drain thereof being connected to the negative potential; and
    a sixth transistor, with a gate thereof being connected to the drain of the third transistor; a source thereof being connected to the gate drive signal output terminal of the second pull-up module, and a drain thereof being connected to the negative potential.

12. The gate drive circuit according to claim 8, wherein the second pull-down holding module comprises:
    a seventh transistor, with a gate thereof receiving the second pull-down holding control signal, a source thereof being connected to an input terminal of a previous stage of gate drive signal of the pull-up control module, and a drain thereof being connected to the output terminal of the first pull-up module; and an eighth transistor, with a gate thereof being connected to the gate of the seventh transistor, a source thereof being connected to the gate drive signal output terminal of the second pull-up module, and a drain thereof being connected to the negative potential.

13. The gate drive circuit according to claim 9, wherein the second pull-down holding module comprises:

a seventh transistor, with a gate thereof receiving the second pull-down holding control signal, a source thereof being connected to an input terminal of a previous stage of gate drive signal of the pull-up control module, and a drain thereof being connected to the output terminal of the first pull-up module; and an eighth transistor, with a gate thereof being connected to the gate of the seventh transistor, a source thereof being connected to the gate drive signal output terminal of the second pull-up module, and a drain thereof being connected to the negative potential.

* * * * *